(12) United States Patent
Chen et al.

(10) Patent No.: US 11,551,948 B2
(45) Date of Patent: Jan. 10, 2023

(54) SEMICONDUCTOR MANUFACTURING APPARATUS

(71) Applicant: SHANGHAI MICRO ELECTRONICS EQUIPMENT (GROUP) CO., LTD., Shanghai (CN)

(72) Inventors: Feibiao Chen, Shanghai (CN); Song Guo, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 399 days.

(21) Appl. No.: 16/637,639

(22) PCT Filed: Aug. 9, 2018

(86) PCT No.: PCT/CN2018/099545
§ 371 (c)(1),
(2) Date: Feb. 7, 2020

(87) PCT Pub. No.: WO2019/029602
PCT Pub. Date: Feb. 14, 2019

(65) Prior Publication Data
US 2020/0273730 A1    Aug. 27, 2020

(30) Foreign Application Priority Data
Aug. 10, 2017  (CN) .................. 201710682504.X

(51) Int. Cl.
*G11C 11/00* (2006.01)
*H01L 21/67* (2006.01)
(Continued)

(52) U.S. Cl.
CPC .. *H01L 21/67144* (2013.01); *B29C 45/14008* (2013.01); *B29C 65/48* (2013.01);
(Continued)

(58) Field of Classification Search
CPC ......... H01L 21/67144; H01L 21/67126; H01L 21/6838; B29C 45/14008; B29C 65/48; B29C 2031/34; G11C 5/04
See application file for complete search history.

(56) References Cited

U.S. PATENT DOCUMENTS 6,788,546 B1 * 9/2004 Steiert .................. H05K 1/0263
  257/E23.169
9,519,009 B2   12/2016 Murakami et al.
(Continued)

FOREIGN PATENT DOCUMENTS

CN   102592962 A   7/2012
CN   103367208 A   10/2013
(Continued)

*Primary Examiner* — Pho M Luu
(74) *Attorney, Agent, or Firm* — Muncy, Geissler, Olds & Lowe, P.C.

(57) ABSTRACT

A semiconductor manufacturing apparatus, including a chip supply module used for providing a plurality of chips; a load plate supply module including a load plate and a load-plate motion platform used for holding the load plate; a chip transfer-loading module including a chip transfer-loading platform used for suctioning chips. The chip transfer-loading platform is used at a first position for transferring chips from the chip supply module. The chip transfer-loading platform carries the chips to a second position to bond the chips onto a load plate to form a bonding sheet. A packaging module is used for packaging the bonding plate on the load-plate motion platform to form a packaged chip.

12 Claims, 3 Drawing Sheets

(51) Int. Cl.
*B29C 45/14* (2006.01)
*B29C 65/48* (2006.01)
*H01L 21/677* (2006.01)
*H01L 21/683* (2006.01)
*G11C 5/04* (2006.01)
*B29L 31/34* (2006.01)

(52) U.S. Cl.
CPC .......... *G11C 5/04* (2013.01); *H01L 21/67126* (2013.01); *H01L 21/67742* (2013.01); *H01L 21/6838* (2013.01); *B29L 2031/34* (2013.01)

(56) References Cited

U.S. PATENT DOCUMENTS

| | | | | |
|---|---|---|---|---|
| 10,127,153 | B1* | 11/2018 | Vash | G06F 9/3836 |
| 2005/0023659 | A1* | 2/2005 | Lee | H01L 25/105 |
| | | | | 257/E25.023 |
| 2014/0017822 | A1 | 1/2014 | Sakai et al. | |

FOREIGN PATENT DOCUMENTS

| | | |
|---|---|---|
| CN | 103681439 A | 3/2014 |
| CN | 104078373 A | 10/2014 |
| CN | 104183527 A | 12/2014 |
| CN | 105023857 A | 11/2015 |
| CN | 105470173 A | 4/2016 |
| JP | H05129372 A | 5/1993 |
| JP | 2000025709 A | 1/2000 |
| JP | 2000058707 A | 2/2000 |
| JP | 2004179523 A | 6/2004 |
| JP | 2006203023 A | 8/2006 |
| JP | 2009200203 A | 9/2009 |
| JP | 2016016635 A | 2/2016 |
| KR | 20180100364 A | 9/2018 |
| TW | M521802 U | 5/2016 |
| WO | WO2015104890 A1 | 7/2015 |

* cited by examiner

SEMICONDUCTOR MANUFACTURING APPARATUS

TECHNICAL FIELD

The present invention relates to the field of semiconductor manufacturing and, in particular, to a semiconductor manufacturing apparatus.

BACKGROUND

Chip bonding techniques can maximize the stacking and integration of chips in a limited space without narrowing the wire width, while reducing the volume of packaged chips and the lengths of conduction paths, thereby enhancing the chip transmission efficiency. With the development of the light, thin and miniaturized electronics, chip bonding techniques are increasingly utilized. When combined with a wafer-level packaging process, the chip bonding process is able to produce a packaging form having a smaller packaging size and a higher performance. Moreover, when combined with a through-silicon via (TSV) process, the chip bonding process is able to manufacture a chip structure that is more competitive in terms of cost and performance.

Compared to the wafer-to-wafer bonding technique, chip-to-wafer bonding technique has a higher yield and a lower product cost. Current manufacturing process requires two separated process, i.e. bonding procedure and packaging procedure, which results in a complicated and laborious manufacturing process.

SUMMARY

It is an object of the present application to provide a semiconductor manufacturing apparatus for solving the problem of a complicated manufacturing process due to the two separated procedures, chip bonding and chip packaging.

To the foregoing end, the semiconductor manufacturing apparatus provided in the present application comprises a chip supply module configured to supply a plurality of chips, a carrying board supply module including a carrying board and a carrying board motion stage for supporting the carrying board, a chip transfer module including a chip transfer stage for sucking the plurality of chips, the chip transfer stage configured to receive the plurality of chips from the chip supply module at a first position and carry the plurality of chips to a second position to bond the plurality of chips to the carrying board, so as to Irwin bonded chips; and a packaging module configured to package the bonded chips on the carrying board motion stage, so as to form packaged chips.

Optionally, the chip supply module may comprise a chip supply stage, wherein the chip transfer stage is arranged above the chip supply stage and comprises a chip suction surface opposite to a chip placed on the chip supply stage, and wherein the semiconductor manufacturing apparatus further comprises a chip picker disposed between the chip transfer stage and the chip supply stage, the chip picker configured to pick up a chip from the chip supply stage and transfer the chip to the chip transfer stage after flipping the chip 180 degrees in its axial direction.

Optionally, the chip supply module may further comprise: a blue tape store, a loading manipulator and an ejecting pin assembly. The blue tape store is configured to store a plurality of blue tapes, each of which is provided with a plurality of chips. The loading manipulator is configured to pick up a blue tape from the blue tape store and place the blue tape onto the chip supply stage. The ejecting pin assembly is configured to push a chip on the blue tape.

Optionally, the carrying board supply module may further comprise a packaged chip store and an unloading manipulator, the unloading manipulator configured to pick up a packaged chip from the carrying board motion stage and place the packaged chip into the packaged chip store.

Optionally, the semiconductor manufacturing apparatus may further comprise a position adjustment module that is disposed between the chip supply module and the carrying board supply module and is configured to adjust position of a chip placed on the chip transfer stage.

Optionally, the position adjustment module may comprise an alignment unit and an adjustment unit, the adjustment unit configured to move the chip when an offset of the position of the chip is detected by the alignment unit.

Optionally, the packaging module may comprise a packaging material supply unit and one or more injection molding units, the packaging material supply unit configured to store a packaging material, and supply the packaging material to the the injection molding units after heating the packaging material, the injection molding units configured to process the packaging material and deliver the packaging material to a bonded chip.

Optionally, the packaging module may comprise two injection molding units symmetrically distributed on opposing sides of the carrying board.

Optionally, each of the injection molding units may comprise a flow channel for outflow of the packaging material, and the flow channel of each injection molding unit is in communication with a gap between the chip transfer stage and the carrying board.

Optionally, the packaging module may further comprise an adhesive storage and supply unit disposed below the injection molding unit and an adhesive application unit disposed above the adhesive storage and supply unit. The adhesive storage and supply unit is configured to supply the adhesive application unit with a bonding adhesive, and the adhesive application unit is configured to apply the bonding adhesive to a surface of the carrying board.

Optionally, the carrying board motion stage may be able to heat the carrying board.

Optionally, the chip transfer module may further comprise a delivery mechanism which has the chip transfer stage disposed thereon and configured to drive the chip transfer stage to move.

The semiconductor manufacturing apparatus provided in the present application comprises the chip supply module, chip picker, chip transfer module, carrying board supply module and packaging module. The chip transfer module comprises the chip transfer stage that is able to suck a plurality of chips, and the carrying board supply module comprises the carrying board and the carrying board motion stage. The chip picker is configured to pick up chips from the chip supply module and transfer them to the chip transfer stage. The chip transfer stage carries the plurality of chips and moves to the bonding work position, and the carrying board motion stage carries the carrying board and moves to the bonding work position. The relative motion of the chip transfer stage and the carrying board motion stage allows the plurality of chips to be bonded to the carrying board and forms bonded chips. The packaging module packages the bonded chips carried on the carrying board motion stage to form packaged chips. The semiconductor manufacturing apparatus of the present application integrates bonding procedure and packaging procedure into a single optimized manufacturing process, allowing to decrease process steps and equipment cost. The equipment cost is reduced in that the operation which is completed by more than one device in the current technique is finished by only one device. In addition, the carrying board in the present application is able to be quickly and repeatedly used, enabling to save material cost of current manufacturing process.

1—a chip transfer module; 11—delivery mechanism; 12—transfer stage; 21—carrying board motion stage; 22—carrying board; 23—packaged chip store; 23n—packaged chip; 24—unloading manipulator; 25—detection unit; 3—position adjustment module; 31—position adjustment stage; 32—alignment unit; 33—adjustment unit; 41—chip supply stage; 42—ejecting pin assembly; 43—blue tape store; 43n—blue tape; 431—chip; 44—loading manipulator; 5—packaging module; 51—packaging material supply unit; 52—injection molding unit; 53—packaging motion stage; 54—adhesive storage and supply unit; 55—adhesive application unit; 6—chip picker; POS A—bonding and packaging work position; POS B—unloading work position; PUS C—bonding work position; POS D—packaging work position; and POS E—debonding work position.

DETAILED DESCRIPTION

Specific embodiments of the present application will be described in greater detail below with reference to the accompanying drawings. Features and advantages of the application will be more apparent from the following detailed description and the appended claims. It should be noted that the accompanying drawings are provided in a very simplified form and not necessarily presented to exact scale, with the only intention to facilitate convenience and clarity in explaining the object of the present invention.

Embodiment 1

Figure 1:
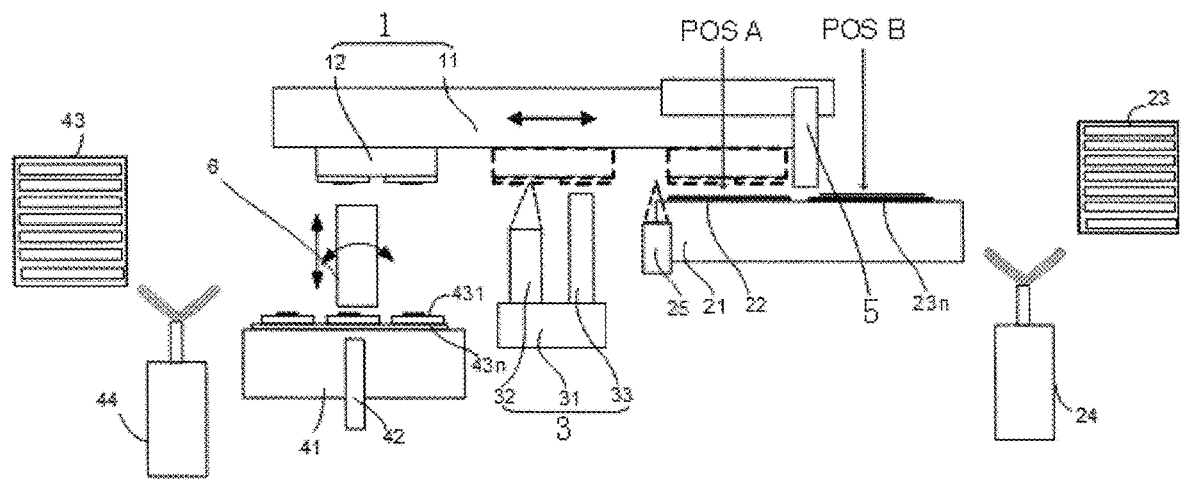
FIG. 1 and FIG. 2 schematically illustrate a semiconductor manufacturing apparatus according to embodiment 1.

Referring to FIG. 1, which schematically illustrates a semiconductor manufacturing apparatus according to embodiment 1. As shown in FIG. 1, the semiconductor manufacturing apparatus includes a chip supply module, a chip picker 6, a chip transfer module 1, a carrying board supply module and a packaging module 5. The chip transfer module 1 comprises the chip transfer stage 12 that is able to suck a plurality of chips, and the carrying board supply module comprises the carrying board 22 and the carrying board motion stage 21. The chip picker 6 is configured to pick up chips from the chip supply module and transfer them to the chip transfer stage 12. The chip transfer stage 12 carries the plurality of chips and moves to the bonding work position, and the carrying board motion stage 21 carries the carrying board 22 and moves to the bonding work position. The relative motion of the chip transfer stage 12 and the carrying board motion stage 21 allows the plurality of chips 431 to be bonded to the carrying board 22 and forms bonded chips. The packaging module 5 packages the bonded chips carried on the carrying board motion stage 21 to form packaged chips. The semiconductor manufacturing apparatus of the present application integrates bonding procedure and packaging procedure into a single optimized manufacturing process, allowing to decrease process steps and equipment cost. The equipment cost is reduced in that the operation which is completed by more than one device in the current technique is finished by only one device. In addition, the carrying board in the present application is able to be quickly and repeatedly used, enabling to save material cost of current manufacturing process.

Figure 2:
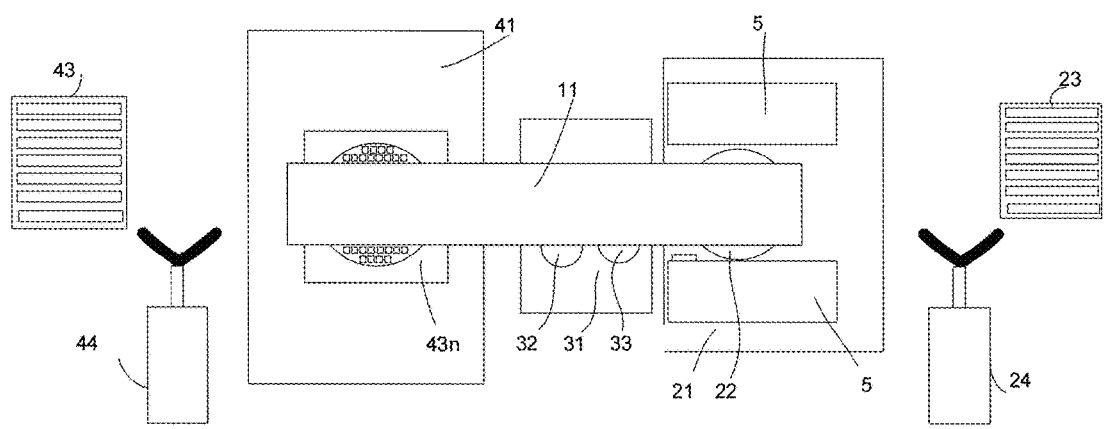

Referring to FIG. 1 and FIG. 2, the blue tape store 43 is used to store a plurality blue tape (n=1, 2 . . . ). The loading manipulator 44 grabs the blue tape 43n and places it on the chip supply stage 41 of the chip supply module. There are a plurality of chips 431 placed on the blue tape 43n and the chip supply stage 41 moves horizontally. When one of the plurality of chips 431 is moved right above the ejecting pin assembly 42, the ejecting pin assembly 42 moves upward to push up the chip 431, and the chip picker then picks up the chip 431 and axially flips 180 degrees to place the chip 431 onto the transfer stage 12 of the chip transfer module 1. The chip supply stage 41 and chip picker 6 cooperate to repeat this process until a set of chips 431 are placed onto the transfer stage 12.

The transfer stage 12 is disposed above the chip supply stage 41 and has a chip suction surface opposite to the chip placed on the chip supply stage 41. The chip picker 6 is disposed between the transfer stage 12 and chip supply stage 41 and is configured to pick up a chip from the chip supply stage 41, axially flips 180 degrees and transfers the picked chip to the transfer stage 12. The set of chips 431 are sucked by the transfer stage 12, and the transfer stage 12 is driven by the delivery mechanism 11 to move above the position adjustment module 3. The position adjustment module 3 includes the position adjustment stage 31, and the alignment unit 32 and an adjustment unit 33 that are disposed on the position adjustment stage 31. The alignment unit 32 is configured to detect the position of the chip 431. If an offset of the position of the chip 431 is detected, the adjustment unit 33 moves to the chip having a positional offset and toggle the chip to push it to the correct position. Alternatively, when the offset of the position of the chip 431 is too large to be corrected, the adjustment unit 33 may pick the chip 431 having a positional offset down and then reposition it at a correct position. Preferably, a plurality of such alignment units 32 and a plurality of such adjustment units 33 may be provided and operate simultaneously to perform detection and adjustment, so that a higher efficiency of the apparatus can be obtained.

When each of the set of the chips 431 placed on the transfer stage 12 are located at the correct position, the transfer stage 12 is driven by the delivery mechanism 11 to move to the bonding work position (i.e., arriving at "POS A"). Here, the bonding work position refers to the position where the plurality of chips 431 are bonded to the carrying board 22 to form bonded chips. The carrying board supply module comprises carrying board motion stage 21 and the carrying board 22 disposed on the carrying board motion stage 21. The carrying board 22 may be provided with one layer of coating of chip protection material for protecting the chips 431 from physical damage. When the transfer stage 12 arrives at POS A, the carrying board motion stage 21 transports the carrying board 22 to POS A, so that the carrying board 22 corresponds to the chips on the transfer stage 12. Subsequently, the carrying board motion stage 21 moves vertically and is be docked with the transfer stage 12 for bonding the chips carried on the transfer stage 12 to the carrying board 22. Preferably, the carrying board supply module further includes a detection unit 25 for detecting whether the transfer stage 12 has arrived at POS A.

Figure 3:
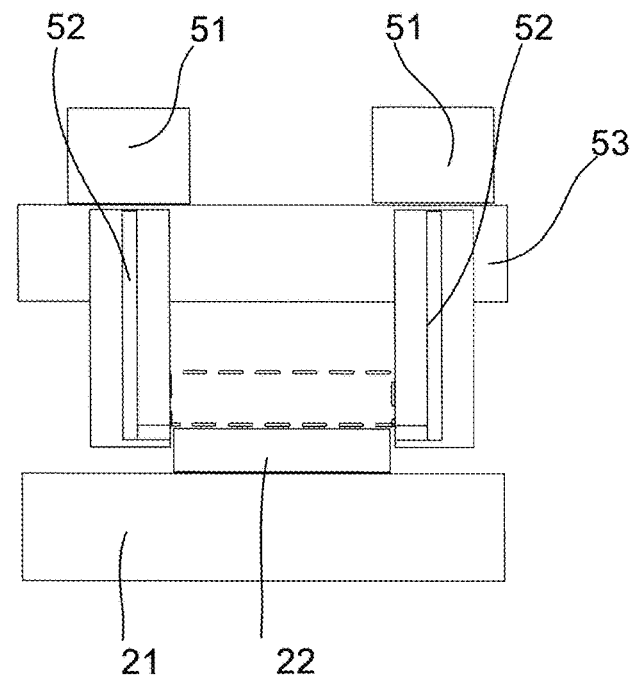
FIG. 3 schematically illustrates a packaging module according to embodiment 1.

As shown in FIG. 3, the packaging module 5 includes a packaging material supply unit 51, an injection molding unit 52 and a packaging motion stage 53 for supporting the packaging material supply unit 51 and the injection molding unit 52. The packaging material supply unit 51 can store and heat the packaging material. Preferably, a plurality of such packaging material supply units 51 may be provided to store a greater amount of the packaging material, thereby reducing the number of times of replacement or addition of the packaging material and enhancing the output of the apparatus. The injection molding unit 52 is configured to process and deliver packaging material and may have a flow channel for outflow of the packaging material. Preferably, a plurality of such injection molding units 52 may be provided. More preferably, two such injection molding units 52 may be provided. In this case, the two injection molding units 52 may be symmetrically distributed on opposing sides of the carrying board 22 of the carrying board motion stage 21. The injection molding unit 52 is able to pressurize the packaging material in the flow channel for a better flow rate control of the packaging material.

Referring to FIG. 1 to FIG. 3, after the bonding of the chips 431, the material supply unit 51 and injection molding unit 52 moves downward together with the movement of the packaging motion stage 53 of the packaging module 5, so that the flow channel of the injection molding unit 52 comes into communication with a gap between the transfer stage 12 and the carrying board 22 and injects the packaging material between the transfer stage 12 and the carrying board 22 to perform the packaging of a set of chips 431 and thus form the packaged chips 23$n$ (n=1, 2 . . . ). A bump is formed on the suction cup that is configured to suck chips and is disposed on the transfer stage 12. During packaging procedure, the transfer stage 12 and the carrying board motion stage 21 keep in the bonding action. In this case, the bump allows to tightly press the chips against the carrying board 22 in order to avoid dislocation of the chips due to force from the injection molding.

After completion of the packaging, the packaging module 5 is returned to the original position, and the transfer stage 12 moves above the chip supply module to receive next batch of chips. In addition, the packaged chips 23$n$ are carried by the carrying board 22, and the carrying board 22 is moved, by the carrying board motion stage 21 to an unloading work position (i.e., "POS B" work position). Here, the unloading work position refers to the position of the packaged chips on the carrying board for transferring to the packaged chip store. The unloading manipulator 24 grabs the packaged chips 23$n$ from the carrying board 22 and places them into the packaged chip store 23. Afterward, the carrying board motion stage 21 moves the carrying board 22 back to POS A. The above operations are repeatedly performed in the above-mentioned manner.

Embodiment 2

Figure 4:
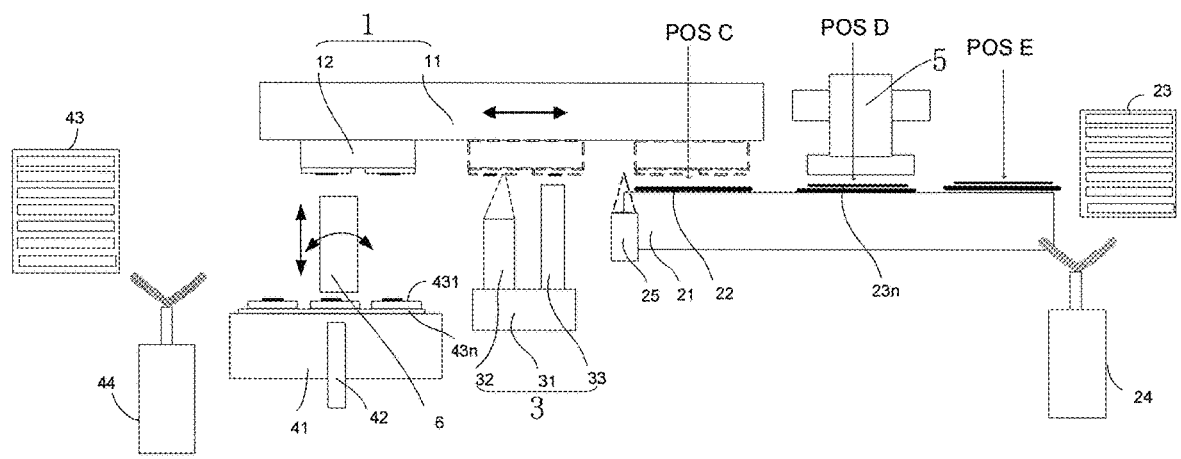
FIG. 4 and FIG. 5 schematically illustrate a semiconductor manufacturing apparatus according to embodiment 2.
Figure 5:
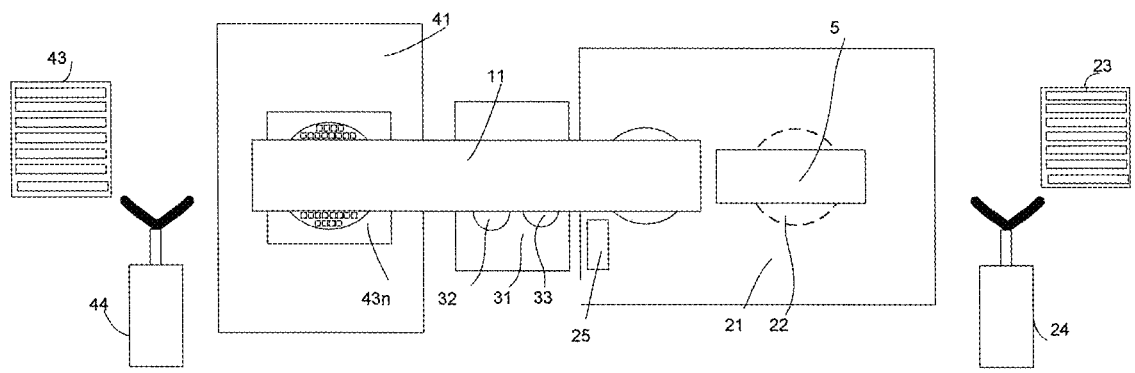

Referring to FIG. 4 and FIG. 5, in this embodiment, bonding and packaging of the chips are carried out in different steps and at different work positions. As shown in FIG. 4, the chips 431 are first bonded to the carrying board 22 at the POS C work position and then packaged at POS D work position.

Figure 6:
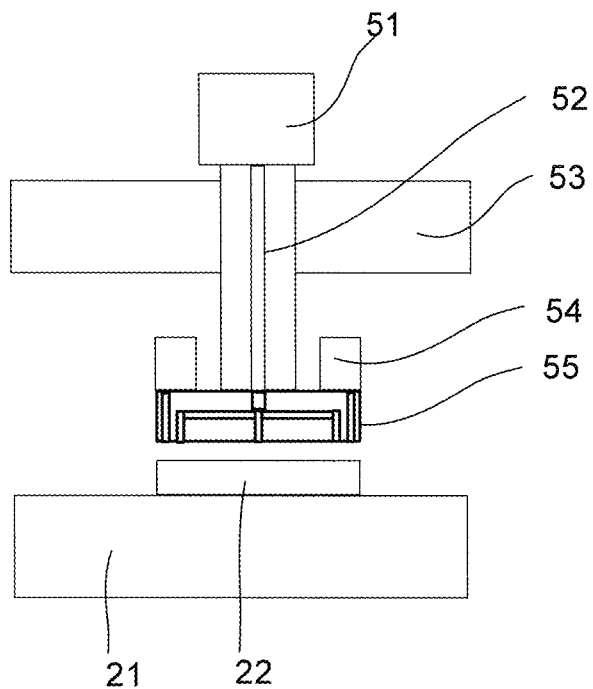
FIG. 6 schematically illustrates a packaging module according to embodiment 2.

Referring to FIG. 6, in this embodiment, in addition to the packaging material supply unit 51, injection molding unit 52 and packaging motion stage 53, the packaging module 5 further includes an adhesive storage and supply unit 54 and an adhesive application unit 55. Preferably, a plurality of adhesive storage and supply units 54 and a plurality of adhesive application units 55 may be included in order to achieve a higher adhesive application efficiency. The adhesive storage and supply unit 54 is configured to provide a bonding adhesive to the adhesive application unit 55, while the adhesive application unit 55 is configured to apply the bonding adhesive to the surface of the carrying board 22. Preferably, the adhesive application unit 55 is able to pressurize the bonding adhesive, so as to achieve a better control of flow rate of the adhesive.

Specifically, at first, the carrying board 22 stays at POS D, and the packaging motion stage 53 of the packaging module 5 moves downward to allow the adhesive application unit 55 to uniformly apply the bonding adhesive to the surface of the carrying board 22. After completion of the application, the packaging motion stage 53 returns to the original position, and the carrying board 22 is moved to POS C. After the transfer stage 12 has arrived at POS C, the carrying board 22 cooperates with the transfer stage 12 to bond the chips 431 to the carrying board 22. After the chips 431 have been firmly bonded to the carrying board 22 and the bonded chips have been thereby formed, the transfer stage 12 is returned to its original position, and the carrying board 22 again moves to POS D. Afterward, the packaging module 5 moves downward and performs packaging to form the packaged chips 23$n$. Subsequently, the carrying board motion stage 21 continues to carry the carrying board 21 having packaged chips 23$n$ to POS E, where the carrying board motion stage 21 heats the packaged chips 23$n$ to make the bonding adhesive between the packaged chips 23$n$ and the carrying board 22 lose tackiness. The unloading manipulator 24 then grabs the packaged chips 23$n$ and places them into the packaged chip store 23, and the carrying board 22 is again moved to POS D. The above operations are repeatedly performed in the above-mentioned manner.

In this embodiment, one layer of bonding adhesive is applied to the surface of the carrying board 22 prior to the packaging of the chips. After completion of packaging, the packaged chip 23$n$ is heated to make the layer of bonding adhesive lose tackiness, so that the carrying board 22 is able to be reused after removal of the packaged chips 23$n$, avoiding a number of steps including loading and unloading of chips. It should be noted that the debonding is not limited to be achieved by heating described in this embodiment, any method that can lose the tackiness of the bonding adhesive falls within the protection scope of the present application. The semiconductor manufacturing apparatus of the present application integrates bonding procedure and packaging procedure into a single optimized manufacturing process, allowing to decrease process steps and equipment cost. The equipment cost is reduced in that the operation which is completed by more than one device in the current technique is finished by only one device. In addition, the carrying board in the present application is able to be quickly and repeatedly used, enabling to save material cost of current manufacturing process.

The description presented above is merely a few preferred embodiments of the present application and is not intended to limit the present application. Those skilled in the art can make any equivalent replacement and modification to the technical solution and technical contents disclosed in the present application without departing from the scope of the technical solution of the present application. All of such replacements and modifications belong to the content that does not depart from the technical solution of the present application, and still fall within the protection scope of the present invention.

What is claimed is:

1. A semiconductor manufacturing apparatus, comprising:
a chip supply module configured to supply a plurality of chips;
a carrying board supply module comprising a carrying board and a carrying board motion stage for supporting the carrying board;
a chip transfer module comprising a chip transfer stage for sucking the plurality of chips, wherein the chip transfer stage is configured to receive the plurality of chips from the chip supply module at a first position and carry the plurality of chips to a second position to bond the plurality of chips to the carrying board, so as to form bonded chips; and
a packaging module configured to package the bonded chips on the carrying board motion stage, so as to form packaged chips;
wherein the carrying board supply module further comprises a packaged chip store and an unloading manipulator, and the unloading manipulator is configured to pick up a packaged chip from the carrying board motion stage and place the packaged chip into the packaged chip store.

2. The semiconductor manufacturing apparatus of claim 1, wherein the chip supply module comprises a chip supply stage, wherein the chip transfer stage is arranged above the chip supply stage and comprises a chip suction surface opposite to a chip placed on the chip supply stage, and wherein the semiconductor manufacturing apparatus further comprises a chip picker disposed between the chip transfer stage and the chip supply stage, the chip picker configured to pick up a chip from the chip supply stage and transfer the chip to the chip transfer stage after flipping the chip 180 degrees in an axial direction of the chip.

3. The semiconductor manufacturing apparatus of claim 2, wherein the chip supply module further comprises: a blue tape store, a loading manipulator and an ejecting pin assembly, wherein the blue tape store is configured to store a plurality of blue tapes, each of which is provided with a plurality of chips, wherein the loading manipulator is configured to pick up a blue tape from the blue tape store and place the blue tape onto the chip supply stage, and wherein the ejecting pin assembly is configured to push up a chip on the blue tape.

4. The semiconductor manufacturing apparatus of claim 1, further comprising a position adjustment module that is disposed between the chip supply module and the carrying board supply module and is configured to adjust position of a chip placed on the chip transfer stage.

5. The semiconductor manufacturing apparatus of claim 4, wherein the position adjustment module comprises an alignment unit and an adjustment unit, and wherein the adjustment unit is configured to move the chip when an offset of the position of the chip is detected by the alignment unit.

6. The semiconductor manufacturing apparatus of claim 1, wherein the packaging module comprises a packaging material supply unit and one or more injection molding units,
wherein the packaging material supply unit is configured to store a packaging material, and supply the packaging material to the injection molding units after heating the packaging material, the injection molding units is configured to process the packaging material and deliver the packaging material to a bonded chip.

7. The semiconductor manufacturing apparatus of claim 6, wherein the packaging module comprises two injection molding units symmetrically distributed on opposing sides of the carrying board.

8. The semiconductor manufacturing apparatus of claim 7, wherein each of the injection molding units comprises a flow channel for outflow of the packaging material, and the flow channel of each injection molding unit is in communication with a gap between the chip transfer stage and the carrying board.

9. The semiconductor manufacturing apparatus of claim 6, wherein each of the injection molding units comprises a flow channel for outflow of the packaging material, and the flow channel of each injection molding unit is in communication with a gap between the chip transfer stage and the carrying board.

10. The semiconductor manufacturing apparatus of claim 6, wherein the packaging module further comprises an adhesive storage and supply unit disposed below the injection molding unit and an adhesive application unit disposed above the adhesive storage and supply unit,
wherein the adhesive storage and supply unit is configured to supply the adhesive application unit with a bonding adhesive, and the adhesive application unit is configured to apply the bonding adhesive to a surface of the carrying board.

11. The semiconductor manufacturing apparatus of claim 10, wherein the carrying board motion stage is able to heat the carrying board.

12. The semiconductor manufacturing apparatus of claim 10, wherein the chip transfer module further comprises a delivery mechanism, and wherein the delivery mechanism has the chip transfer stage disposed thereon and is configured to drive the chip transfer stage to move.

* * * * *